(12) United States Patent
Wen et al.

(10) Patent No.: US 7,615,992 B2
(45) Date of Patent: Nov. 10, 2009

(54) APPARATUS AND METHOD FOR DETECTING ELECTRONIC DEVICE TESTING SOCKET

(75) Inventors: Ping-Cheng Wen, Kaohsiung County (TW); Wei-Jen Hsueh, Kaohsiung (TW); Jen-Kuei Li, Tainan County (TW); Chiu-Cheng Lin, Kaohsiung County (TW)

(73) Assignee: Advanced Semiconductor Engineering, Inc., Kaohisung (TW)

( * ) Notice: Subject to any disclaimer, the term of this patent is extended or adjusted under 35 U.S.C. 154(b) by 52 days.

(21) Appl. No.: 12/056,000

(22) Filed: Mar. 26, 2008

(65) Prior Publication Data

US 2009/0189626 A1 Jul. 30, 2009

(30) Foreign Application Priority Data

Jan. 29, 2008 (TW) .............................. 97103275 A

(51) Int. Cl.
*G01R 31/02* (2006.01)
(52) U.S. Cl. .................................. 324/158.1; 324/755
(58) Field of Classification Search .............. 324/158.1, 324/537, 754–765
See application file for complete search history.

(56) References Cited

U.S. PATENT DOCUMENTS

| 6,441,627 | B1 * | 8/2002 | Larson ....................... 324/755 |
| 6,564,455 | B2 * | 5/2003 | Clayton et al. ................ 29/876 |
| 7,208,936 | B2 * | 4/2007 | Goldsmith et al. ........ 324/158.1 |

* cited by examiner

*Primary Examiner*—Ernest F Karlsen
(74) *Attorney, Agent, or Firm*—J.C. Patents

(57) ABSTRACT

An apparatus for detecting an electronic device testing socket including a testing base, a detecting circuit board, a depth gauge, and a conductive pressing block is provided. The detecting circuit board disposed on the testing base has a carrying surface for carrying an electronic device testing socket. The electronic device testing socket includes a plurality of pin units, and each of the pin units includes an S-shaped pin and a pair of elastic rods accommodated within recesses thereof. The depth gauge disposed on the testing base presses against a top surface of the conductive pressing block, and presses with a bottom surface thereof against the electronic device testing socket. The depth gauge is adapted to adjust a distance between the top surface of the conductive pressing block and the carrying surface. The detecting circuit board is electrically connected to the pin units for detecting the status of the pin units.

9 Claims, 4 Drawing Sheets

APPARATUS AND METHOD FOR DETECTING ELECTRONIC DEVICE TESTING SOCKET

CROSS-REFERENCE TO RELATED APPLICATION

This application claims the priority benefit of Taiwan application serial no. 97103275, filed on Jan. 29, 2008. The entirety of the above-mentioned patent application is hereby incorporated by reference herein and made a part of this specification.

BACKGROUND OF THE INVENTION

1. Field of the Invention

The present invention generally relates to an apparatus and a method for detecting an electronic device testing socket, in particular, to an apparatus and a method for detecting whether the pins of the Johns Tech testing socket are co-planar or not, as well as the contact resistance of the pins.

2. Description of Related Art

With the increasing progress of technologies, the integrated circuits (ICs) are fabricated to have smaller volumes and more powerful functions, and under the development trend of the system on chip, the opportunities and applications of integrating ICs on a single chip grow. Therefore, in order to test whether the ICs work normally or not, a movable Johns Tech Socket is usually used for testing ICs in the semiconductor test.

FIG. 1 is a schematic cross-sectional view of the IC test using the Johns Tech Socket. Referring to FIG. 1, in the IC test, the IC 100 under test is usually placed on the Johns Tech Socket 210, and the Johns Tech Socket 210 is connected at a lower portion to a test equipment 200, such that a test signal generated by the test equipment 200 may be transmitted to the IC 100 under test via the Johns Tech Socket 210, so as to perform the IC test. As shown in FIG. 1, the Johns Tech Socket 210 is mainly used to perform a high-frequency test, and includes a plurality of pin units 212. Each of the pin units 212 includes an S-shaped pin 212a and two elastic rods 212b disposed within recesses of the S-shaped pin 212a, so as to form a seesaw structure, and thus, the S-shaped pin 212a is normally conducted with the I/O pad of the IC 100 under test and the test circuit of the test equipment 200. The elastic rods 212b are made of rubber.

After a long period of usage of the Johns Tech Socket 210, it is possible that the S-shaped pins 212a are not located on the same plane, or the resistance of some S-shaped pins 212a increases, or the elastic rod 212b may be broken. According to the above situation, some I/O pads of the IC 100 under test cannot be detected, leading to test errors.

However, currently, the mechanism or method of testing whether the S-shaped pins of such Johns Tech Socket are co-planar or not or whether the resistance of the S-shaped pins increase or not has not been put forward. Thus, the entire Johns Tech Socket must be directly replaced once the test errors are perceived, so as to ensure that the IC test results are correct. However, the cost of IC test may be increased.

SUMMARY OF THE INVENTION

Accordingly, the present invention is directed to an apparatus and a method for testing an electronic device testing socket, so as to detect whether the pin units of the Johns Tech Socket are co-planar or not and to measure the resistance of the pin units. As such, the specific pin unit instead of the entire Johns Tech Socket is replaced, so as to reduce the cost of the IC test.

The present invention provides an apparatus for detecting an electronic device testing socket, which includes a testing base, a detecting circuit board, a depth gauge, and a conductive pressing block. The detecting circuit board disposed on the testing base has a carrying surface for carrying an electronic device testing socket to be detected. The electronic device testing socket includes a plurality of pin units, and each of the pin units includes an S-shaped pin and a pair of elastic rods accommodated within the recesses thereof. The detecting circuit board is electrically connected to the pin units. The depth gauge disposed on the testing base presses against a top surface of the conductive pressing block, and presses with a bottom surface thereof against the electronic device testing socket to be detected. The depth gauge is adapted to adjust a distance between the top surface of the conductive pressing block and the carrying surface. When the conductive pressing block is pressed downward, the detecting circuit board is adapted to detect the status of each pin unit of the electronic device testing socket to be detected.

According to an embodiment of the present invention, the conductive pressing block includes a gold-plating layer disposed on an outer surface thereof.

According to an embodiment of the present invention, the bottom surface of the conductive pressing block is a flat surface.

According to an embodiment of the present invention, the conductive pressing block is connected to the depth gauge.

According to an embodiment of the present invention, the detecting circuit board includes a control unit, a measuring unit, a comparing unit, a display unit, and a power unit. The control unit is used for controlling the overall operation of the detecting circuit board. The measuring unit is electrically connected to the control unit, for measuring a resistance of each pin unit and sends the resistance of each pin unit back to the control unit. The comparing unit is electrically connected to the control unit, so as to compare the resistance of each pin unit measured by the measuring unit with a reference resistance, and then sends a comparison result back to the control unit. The display unit is electrically connected to the control unit, so as to display the conducting status of each pin unit and the comparison result. The power unit is electrically connected to the control unit, so as to supply the power required by the detecting circuit board in operation.

According to an embodiment of the present invention, the display unit further includes a display screen disposed on the testing base, for displaying the resistance of one of the pin units.

According to an embodiment of the present invention, the status of each pin unit of the electronic device testing socket includes whether the S-shaped pins are co-planar or not and a resistance of each S-shaped pin.

The present invention further provides a method for detecting an electronic device testing socket, which includes the following steps. Firstly, the above apparatus for detecting an electronic device testing socket and an electronic device testing socket to be detected are provided. The electronic device testing socket includes a plurality of pin units, and each of the pin units includes an S-shaped pin and a pair of elastic rods accommodated within recesses thereof. Then, the electronic device testing socket is placed on a carrying surface of the detecting circuit board. Finally, the depth gauge is used to adjust a distance between a top surface of the conductive pressing block and the carrying surface. When the conductive pressing block is pressed downward, the detecting circuit board is used to detect the status of each pin unit of the electronic device testing socket to be detected.

According to an embodiment of the present invention, the status of each pin unit of the electronic device testing socket to be detected includes whether the S-shaped pins are co-planar or not and a resistance of each S-shaped pin.

In view of the above, the apparatus and method for detecting an electronic device testing socket according to the present invention is designed directed to the Johns Tech Socket. The apparatus of the present invention is used to detect whether the S-shaped pins of the Johns Tech Socket are co-planar or not and the resistance of each S-shaped pin, so as to replace the specific pin unit with error.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
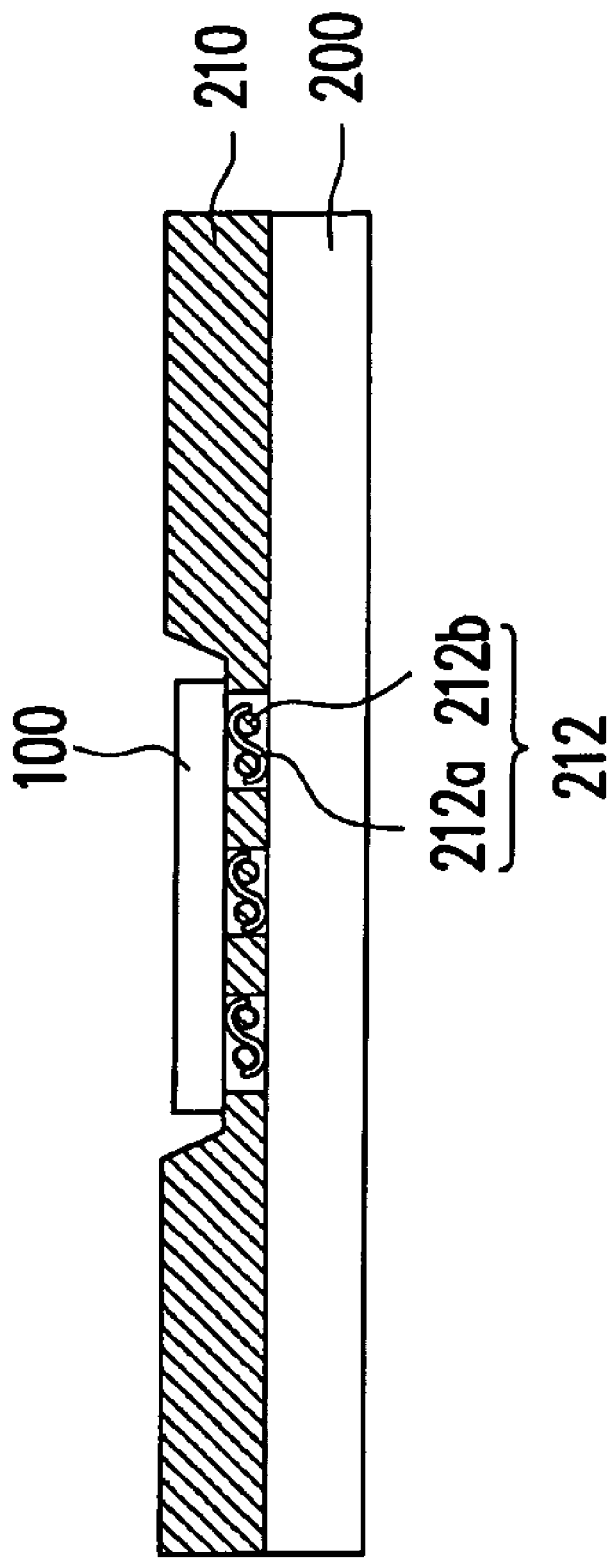
FIG. 1 is a schematic cross-sectional view of an IC test using the Johns Tech Socket.

Reference will now be made in detail to the present embodiments of the invention, examples of which are illustrated in the accompanying drawings. Wherever possible, the same reference numbers are used in the drawings and the description to refer to the same or like parts.

Figure 2:
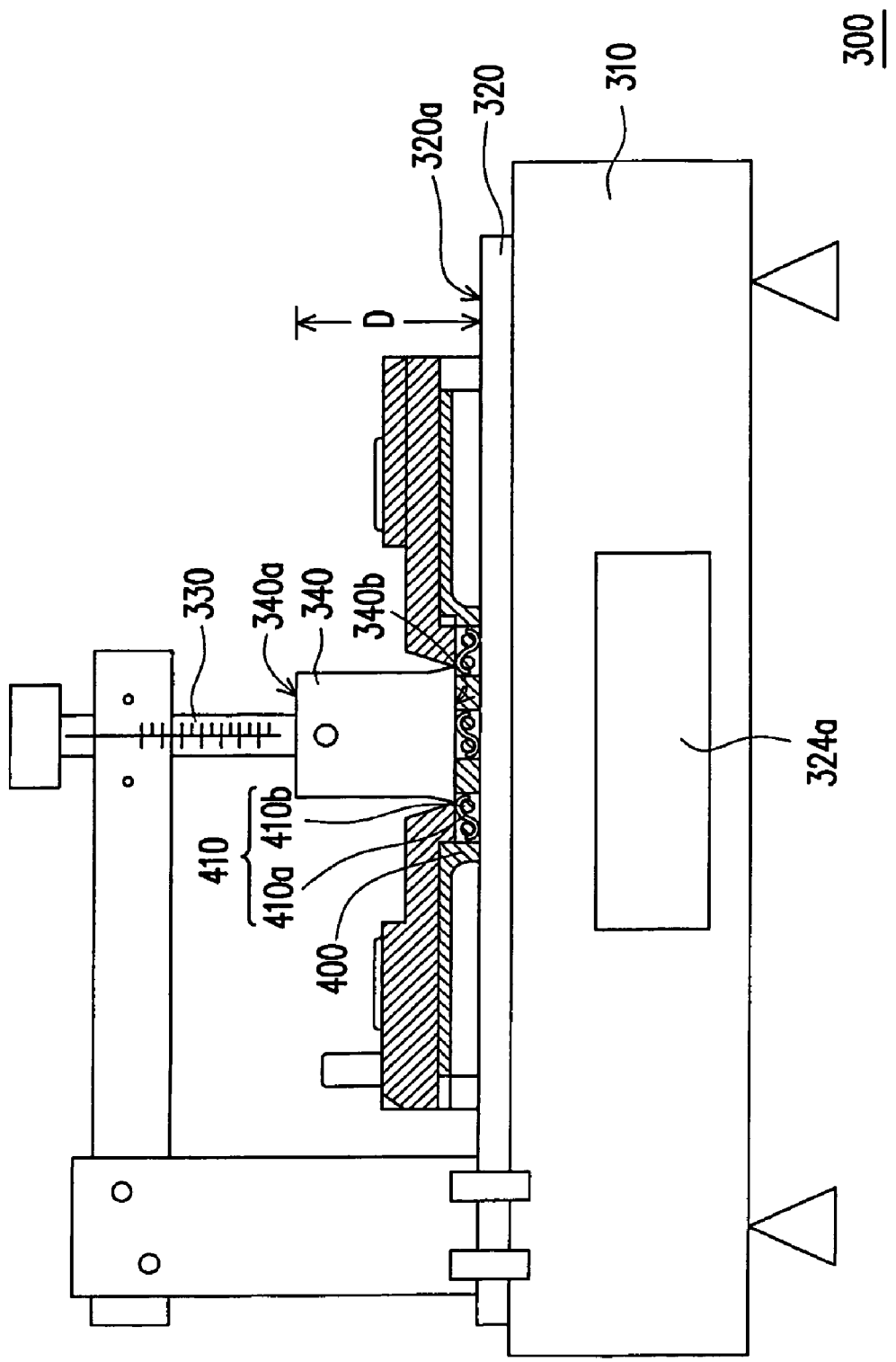
FIG. 2 is a schematic view of the architecture of an apparatus for detecting an electronic device testing socket according to an embodiment of the present invention.

FIG. 2 is a schematic view of the architecture of an apparatus for detecting an electronic device testing socket according to an embodiment of the present invention. Referring to FIG. 2, the apparatus 300 for detecting the electronic device testing socket includes a testing base 310, a detecting circuit board 320, a depth gauge 330, and a conductive pressing block 340. The apparatus 300 for detecting the electronic device testing socket is mainly used for detecting an electronic device testing socket 400. In this embodiment, the electronic device testing socket 400 to be detected is a Johns Tech Socket and includes a plurality of pin units 410. Each of the pin units 410 includes an S-shaped pin 410a and a pair of elastic rods 410b accommodated within recesses thereof. The original status of the pin units 410 is that the S-shaped pins 410a are located on the same plane (i.e., co-planar), and thus, when the electronic device to be detected is placed on the electronic device testing socket 400, the S-shaped pins 410a are used to conduct the I/O pad of the electronic device to be detected and the detect circuit simultaneously, so as to perform the electric detection. However, after a long period of usage of the Johns Tech Socket, some S-shaped pins 410a may be curved or bent, which influences the detecting accuracy of the electronic device testing socket 400. The detecting apparatus 300 of the present invention may be used to detect whether the S-shaped pins 410a are located on the same plane, as well as the resistance thereof, so as to determine which pin unit 410 needs to be replaced. The connection relationship between the elements and those elements of the apparatus 300 for detecting the electronic device testing socket is described below accompanied with the drawings.

The detecting circuit board 320 disposed on the testing base 310 includes a carrying surface 320a for carrying the electronic device testing socket 400 to be detected. The depth gauge 330 is disposed over the testing base 310. The conductive pressing block 340 is placed over the electronic device testing socket 400. Since the bottom surface of the conductive pressing block 340 is a flat surface, the conductive pressing block 340 could be directly attached on the electronic device testing socket 400 and capable of accurately measuring whether the S-shaped pins 410a are co-planar or not. Additionally, the conductive pressing block 340 selectively includes a gold-plating layer (not shown) disposed on an outer surface thereof, so as to prevent the rustiness and thus reduce the resistance thereof. The depth gauge 330 presses against a top surface 340a of the conductive pressing block 340, and a bottom surface 340b of the conductive pressing block 340 presses against the electronic device testing socket 400 to be detected. As such, a user may adjust a distance D between the top surface 340a of the conductive pressing block 340 and the carrying surface 320a through regulating the depth gauge 330. In an embodiment of the present invention, the conductive pressing block 340 is connected to the depth gauge 330.

The detecting circuit board 320 is electrically connected to the pin units 410, for detecting the status of each pin unit 410 of the electronic device testing socket 400 when the conductive pressing block 340 is pressed downward. When the conductive pressing block 340 is pressed downward, which S-shaped pin 410a is curved or bent may be known depending on the conducting sequence of the S-shaped pin 410a, and thus the S-shaped pins 410a are determined whether to be co-planar or not. In addition, the resistance of each S-shaped pin 410a may be measured by the detecting circuit board 320.

Figure 3:
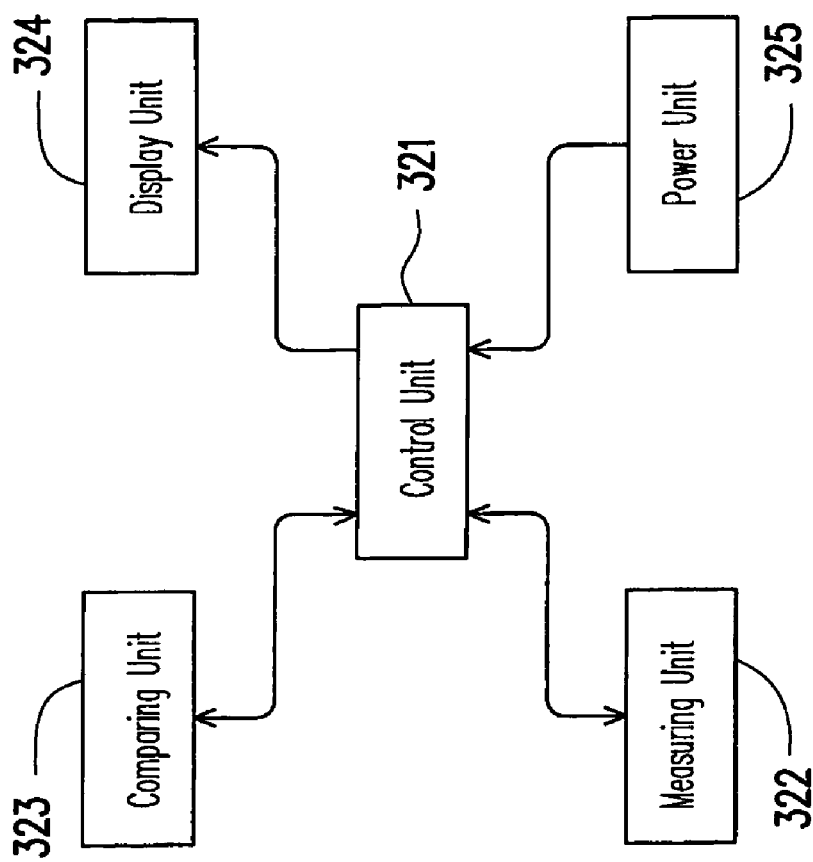
FIG. 3 is a block diagram of a detecting circuit board of the present invention.

FIG. 3 is a block diagram of a detecting circuit board of the present invention. Referring to FIG. 3, the detecting circuit board 320 of the present invention mainly includes a control unit 321, a measuring unit 322, a comparing unit 323, a display unit 324, and a power unit 325. The control unit 321 is used for controlling the overall operation of the detecting circuit board 320. The measuring unit 322 is electrically connected to the control unit 321, for measuring the resistance of the S-shaped pin 410a of each pin unit 410, and sending the resistance of the S-shaped pin 410a of each pin unit 410 back to the control unit 321. The comparing unit 323 is electrically connected to the control unit 321, for comparing the resistance of the S-shaped pin 410a of each pin unit 410 measured by the measuring unit 322 with a preset reference resistance, and sending a comparison result back to the control unit 321, so as to acquire whether the resistance of each S-shaped pin 410a exceeds an acceptable range or not. The display unit 324 is electrically connected to the control unit 321, for displaying the conducting status and the comparison result of each pin unit 410. The power unit 325 is electrically connected to the control unit 321, for supplying the power required by the detecting circuit board 320 in operation.

Furthermore, the display unit 324 includes a plurality of LED lamps (not shown) disposed on the detecting circuit board 320 and a display 324a (shown in FIG. 2) disposed on the testing base 310, and each pin unit 410 corresponds to two LED lamps. When the conductive pressing block 340 being pressed downward is conducted with one of the S-shaped pins 410a, one corresponding LED lamp of this S-shaped pin 410a is lighted up. In this way, the user may acquire which S-shaped pin 410a is curved or bent according to the lighting-up sequence of the LED lamps, so as to replace the pins with errors. Furthermore, if the comparing unit 323 found that the measured resistance of a certain S-shaped pin 410a is greater than the originally preset resistance through comparison, the other corresponding LED lamp of this S-shaped pin 410a is lighted up, so as to inform the user that this S-shaped pin 410a needs to be replaced. Furthermore, the display 324a (for example, an LED display) may be used to display the resistance of a certain selected S-shaped pin 410a.

Figure 4:
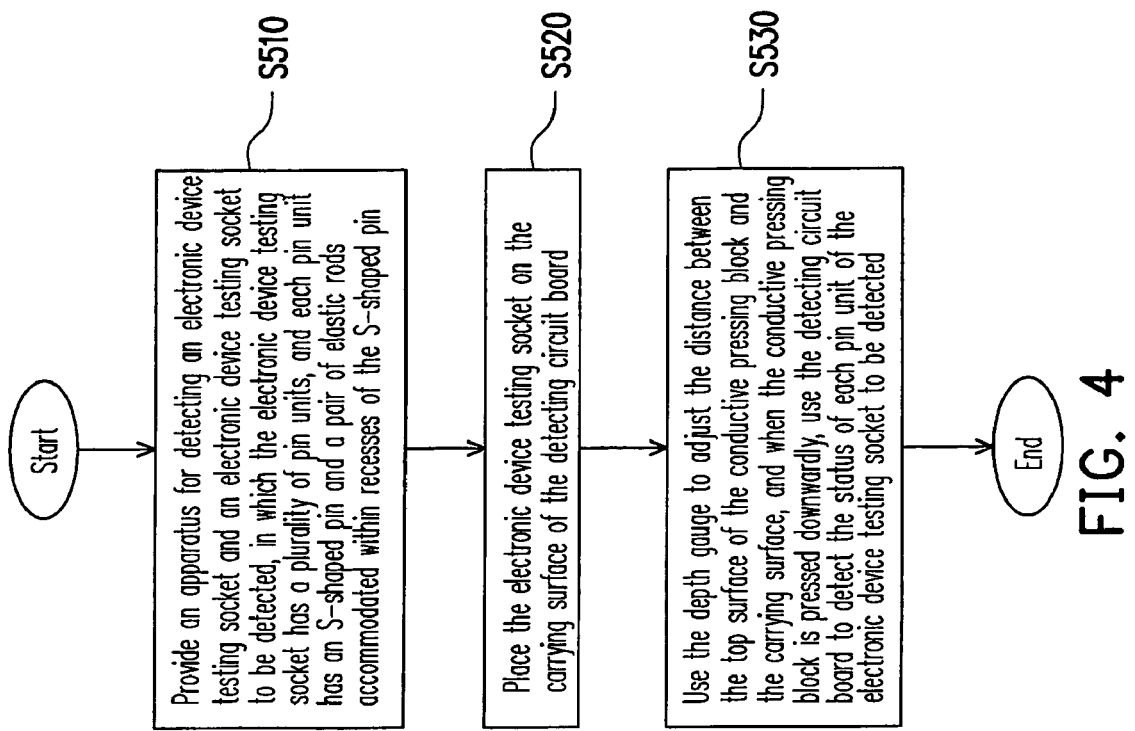
FIG. 4 is a flow chart showing a method for detecting an electronic device testing socket according to an embodiment of the present invention.

FIG. 4 is a flow chart showing a method for detecting an electronic device testing socket according to an embodiment of the present invention. The detection method is applicable to the apparatus 300 for detecting the electronic device testing socket as shown in FIG. 2, so as to detect whether the S-shaped pins 410a in the Johns Tech Socket are located on the same plane or not, as well as the resistance thereof, and to determine which pin unit 410 needs to be replaced.

Referring to FIG. 4, firstly, the apparatus 300 for detecting an electronic device testing socket in FIG. 2 and an electronic device testing socket 400 to be detected are provided. In this embodiment, the electronic device testing socket 400 is a Johns Tech Socket, and includes a plurality of pin units 410. Each pin unit 410 includes an S-shaped pin 410a and a pair of elastic rods 410b accommodated within recesses of the S-shaped pin 410a (S510). Then, the electronic device testing socket 400 is placed on the carrying surface 320a of the detecting circuit board 320 (S520). Finally, the depth gauge 330 is used to adjust the distance D between the top surface 340a of the conductive pressing block 340 and the carrying surface 320a. When the conductive pressing block 340 is pressed downward, the detecting circuit board 320 is used to detect the status of each pin unit 410 of the electronic device testing socket 400 to be detected, for example, to detect whether the S-shaped pins 410a are co-planar or not and the resistance of each S-shaped pin 410a, so as to replace the specific pin unit 410 with error.

To sum up, the apparatus and method for detecting an electronic device testing socket according to the present invention is designed mainly directed to the Johns Tech Socket, and the detecting apparatus is adapted to detect whether the S-shaped pins in the Johns Tech Socket are co-planar or not, as well as the resistance of the S-shaped pins, so as to replace the pin unit with error. Thus, the conventional problems of having no suitable tools for verifying the characteristics of Johns Tech Socket, such as whether the pins are co-planar and what the contact resistance of the pins is, and thus requiring the entire Johns Tech Socket to be replaced and in turn causing an increase in the costs of IC test can be successfully solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for detecting an electronic device testing socket, comprising:
    a testing base;
    a detecting circuit board, disposed on the testing base and having a carrying surface for carrying an electronic device testing socket to be detected, wherein the electronic device testing socket comprises a plurality of pin units, each of the pin units comprises an S-shaped pin and a pair of elastic rods accommodated within recesses of the S-shaped pin, and the detecting circuit board is electrically connected to the pin units;
    a depth gauge, disposed on the testing base; and
    a conductive pressing block, wherein the depth gauge presses against a top surface of the conductive pressing block, a bottom surface of the conductive pressing block presses against the electronic device testing socket to be detected, and the depth gauge is used for adjusting a distance between the top surface of the conductive pressing block and the carrying surface;
    wherein when the conductive pressing block is pressed downward, the detecting circuit board is used for detecting a status of each pin unit of the electronic device testing socket to be detected.

2. The apparatus for detecting an electronic device testing socket according to claim 1, wherein the conductive pressing block comprises a gold-plating layer disposed on an outer surface thereof.

3. The apparatus for detecting an electronic device testing socket according to claim 1, wherein the bottom surface of the conductive pressing block is a flat surface.

4. The apparatus for detecting an electronic device testing socket according to claim 1, wherein the conductive pressing block is connected to the depth gauge.

5. The apparatus for detecting an electronic device testing socket according to claim 1, wherein the detecting circuit board comprises:
    a control unit, for controlling an overall operation of the detecting circuit board;
    a measuring unit, electrically connected to the control unit, for measuring a resistance of each pin unit, and sending the resistance of each pin unit back to the control unit;
    a comparing unit, electrically connected to the control unit, for comparing the resistance of each pin unit measured by the measuring unit with a reference resistance, and sending a comparison result back to the control unit;
    a display unit, electrically connected to the control unit, for displaying a conducting status of each pin unit and the comparison result; and
    a power unit, electrically connected to the control unit, for supplying a power required by the detecting circuit board in operation.

6. The apparatus for detecting an electronic device testing socket according to claim 5, wherein the display unit further comprises a display screen disposed on the testing base, for displaying the resistance of a selected one of the pin units.

7. The apparatus for detecting an electronic device testing socket according to claim 1, wherein the status of each pin unit of the electronic device testing socket to be detected comprises whether the S-shaped pins are co-planar or not and the resistance of each S-shaped pin.

8. A method for detecting an electronic device testing socket, comprising:
    providing the apparatus for detecting an electronic device testing socket according to claim 1 and an electronic device testing socket to be detected, wherein the electronic device testing socket comprises a plurality of pin units, and each of the pin units comprises an S-shaped pin and a pair of elastic rods accommodated within recesses thereof;

placing the electronic device testing socket on a carrying surface of the detecting circuit board; and using a depth gauge to adjust a distance between a top surface of a conductive pressing block and the carrying surface, and when the conductive pressing block is pressed downward, using the detecting circuit board to detect a status of each pin unit of the electronic device testing socket to be detected.

9. The method for detecting an electronic device testing socket according to claim 8, wherein the status of each pin unit of the electronic device testing socket to be detected comprises whether the S-shaped pins are co-planar or not and a resistance of each S-shaped pin.

* * * * *